(12) United States Patent
Gales et al.

(10) Patent No.: US 7,049,007 B2
(45) Date of Patent: May 23, 2006

(54) COMPOSITE FOIL AND ITS MANUFACTURING PROCESS

(75) Inventors: Raymond Gales, Harlange (LU); Michel Streel, Houffalize (BE); Rene Lanners, Bettborn (LU)

(73) Assignee: Circuit Foil Luxembourg Sarl, Wiltz (LU)

( * ) Notice: Subject to any disclaimer, the term of this patent is extended or adjusted under 35 U.S.C. 154(b) by 65 days.

(21) Appl. No.: 10/484,109

(22) PCT Filed: Jul. 10, 2002

(86) PCT No.: PCT/EP02/07665

§ 371 (c)(1),
(2), (4) Date: Jan. 16, 2004

(87) PCT Pub. No.: WO03/008671

PCT Pub. Date: Jan. 30, 2003

(65) Prior Publication Data

US 2004/0209106 A1    Oct. 21, 2004

(30) Foreign Application Priority Data

Jul. 18, 2001 (LU) .......................... 90804

(51) Int. Cl.
*B32B 15/01* (2006.01)
*B32B 15/04* (2006.01)
*B32B 15/20* (2006.01)
*C25D 5/10* (2006.01)
*C25D 5/34* (2006.01)

(52) U.S. Cl. .................. 428/607; 428/606; 428/666; 428/671; 428/674; 428/680; 428/457; 428/336; 205/170; 205/176; 205/181; 205/182; 205/177; 205/183; 205/291

(58) Field of Classification Search ................ 428/606, 428/607, 666, 663, 674, 671, 678, 679, 680, 428/457, 219, 220, 215, 332, 336, 340, 935; 205/111, 125, 170, 176, 181, 182, 177, 183, 205/271, 291, 305, 300

See application file for complete search history.

(56) References Cited

U.S. PATENT DOCUMENTS

| | | | | |
|---|---|---|---|---|
| 4,619,871 A | * | 10/1986 | Takami | 428/607 |
| 5,096,522 A | * | 3/1992 | Kawachi et al. | 156/151 |
| 5,322,975 A | | 6/1994 | Nagy et al. | |
| 5,366,814 A | * | 11/1994 | Yamanishi et al. | 428/607 |
| 6,893,742 B1 | * | 5/2005 | Chen et al. | 428/675 |
| 2003/0148136 A1 | * | 8/2003 | Yamamoto et al. | 428/607 |

FOREIGN PATENT DOCUMENTS

| | | |
|---|---|---|
| EP | 0960725 | 6/1994 |
| GB | 1460846 | 1/1977 |
| WO | WO 00/57680 | 9/2000 |
| WO | WO 01/14135 | 3/2001 |

* cited by examiner

Primary Examiner—Michael E. LaVilla
(74) Attorney, Agent, or Firm—McCormick, Paulding & Huber LLP

(57) ABSTRACT

A peelable composite foil includes a metallic carrier foil, a first barrier layer on one side of the metallic carrier and a second metallic layer on the first barrier layer. The second metallic layer includes a combination of a metal selected from the group including zinc, molybdenum, antimony and tungsten, and an electrodeposited, ultra-thin metal foil on the second metallic layer.

40 Claims, No Drawings

COMPOSITE FOIL AND ITS MANUFACTURING PROCESS

This application is entitled to the benefit of and incorporates by reference in their entireties essential subject matter disclosed in International Application No. PCT/EP02/07665 filed on Jul. 10, 2002 and Luxembourg Patent Application No. 90 804 filed on Jul. 18, 2001.

FIELD OF THE INVENTION

The present invention generally relates to a composite foil and its manufacturing process.

BACKGROUND OF THE INVENTION

Composite foils such as electrodeposited copper foils with carrier foil have been employed as a material for producing printed circuit boards, which are widely used in the electric and electronic industries. In general, the composite foil is bonded, through hot pressing, onto an electrically insulating polymeric substrate such as glass epoxy substrate, phenolic polymer substrate, or polyimide, and the carrier foil is subsequently removed to form a copper-clad laminate.

Using composite foils for preparing copper clad laminates is very advantageous as it protects the surface of the electrodeposited foil against dust, tears and wrinkles during handling and hot-press-forming.

Composite foils are generally divided into two types: i.e. foils with peelable carriers and foils with etchable carriers. Briefly, the difference between the two types of composite foils lies in the method of removing the carrier foil after completion of hot-press-forming. In peelable composite foils, the carrier foil is removed by peeling, whereas in etchable composite foils, the carrier foil is removed by etching.

Peelable composite foils are generally preferred to etchable composite foils as they allow simpler and more precise preparation of copper clad laminates. Indeed, chemical etching of the carrier is long, due to its relatively important thickness, requires several changes of etching baths and results in a rough surface. In addition, it limits the choice in carrier foil since the ultra-thin foil must not be etched.

Peelable composite foils are thus much easier to use than etchable foils. However, a recurrent problem of conventional peelable composite foils is the difficulty of controlling their peel strength, i.e. the force needed to separate the carrier foil from the electrodeposited copper foil. Indeed, during hot-press-forming the peelable composite foil is submitted to high temperatures, which tends to increase the adhesion of the carrier foil and leads to considerable variations in peel strength. In some cases, a carrier foil cannot be removed from the copper clad laminate.

A particularly interesting development in composite foils was made to comply with the actual needs of the electronic industry. Indeed, as electronic equipment becomes smaller and lighter with higher performance, it is necessary to reduce the width of wiring lines and the diameter of via holes which connect layers in multi-layer printed circuit boards (MLB). In order to make via holes of below 200 µm in diameter, generally called microvias, the use of lasers has been proposed.

WO 00/57680 describes a composite foil of the peelable type which is particularly suited to be used in processes for manufacturing multi-layer printed circuit boards, wherein microvias are drilled by means of a $CO_2$ laser. This composite foil comprises a carrier foil, a release layer on one side of the carrier foil, and an ultra-thin copper foil—less than 10 µm thick—having a front side facing the release layer and an opposite back side coated with a resin. In order to improve the absorption of $CO_2$ laser light, the front side of the ultra-thin copper foil has received a surface preparation, in particular to reduce the reflection of the laser light. Hence, after removal (peeling) of the carrier foil, the ultra-thin copper foil has a surface with a low reflectivity, whereby the conditions of laser drilling and thus the drilling speed and the quality of the microvias are improved.

Such a surface preparation of the front side of the ultra-thin copper foil is achieved during the manufacturing of the composite foil. It consists in giving the ultra-thin copper foil a surface colour favouring the absorption of $CO_2$ laser light by forming a thin layer of dark coloured electrically conductive material over the release layer on the carrier foil, before electrodepositing the ultra-thin foil.

A first way of achieving such a surface preparation is carbon deposition. A liquid carbon dispersion, generally containing carbon, one or more surfactants capable of dispersing the carbon, and a liquid dispersing medium such as water, is applied to the side of the release layer which will be facing the ultra-thin copper foil. A dark layer of electrically conductive material is thus formed on the release layer, and the ultrathin copper foil is then electrodeposited on this dark layer.

Alternatively, the dark coloured electrically conductive layer can be formed by a dark coloured electrically conductive polymer. A monomer which is electrically conductive in its polymerised form, such as e.g. pyrrole, is applied to the surface of the release layer by a wet process. The monomer is thereafter polymerised, and the ultra-thin copper foil is electrodeposited over the polymer layer.

Despite the improvement provided by such a composite foil with regard to microvia drilling, the peel strength of such a composite foil is difficult to optimise.

OBJECTS AND SUMMARY OF THE INVENTION

One object of the invention is to provide an improved composite foil of the peelable type, which is particularly suited for use in the electric and electronic industry.

According to the present invention, a composite foil of the peelable type comprises an electrodeposited, ultra-thin metal foil supported on one side of a metallic carrier foil. A first barrier layer is provided on the metallic carrier foil and a second metallic layer is provided in-between the first barrier layer and the ultra-thin metal foil. The second metallic layer comprises a combination of a metal selected from the group comprising zinc, copper and cobalt, and of at least one metal selected from the group comprising arsenic, manganese, tin, vanadium, molybdenum, antimony and tungsten.

It shall be appreciated that the adherence of the second metallic layer to the ultra-thin metal foil is such that, when the latter is separated from the carrier foil, at least part of the second metallic layer remains on the ultra-thin metal foil. Indeed, the second metallic layer may completely separate from the carrier foil when it is removed, or only partially. In this latter case, the separation between the carrier foil and the ultra-thin metal foil occurs within the second metallic layer and the ultra-thin metal foil is covered by a certain thickness of material from the second metallic layer.

It will further be appreciated that the peelable composite foil of the present invention exhibits an appropriate peel strength, even after exposure to heat. The term "appropriate peel strength" as used herein refers to a peel strength within a range of 1 to 200 N/m as measured according to international standard IPC-4562 (paragraphs 4–6–8). This range lies within a range determined by taking into account user's ideal demand for the composite foil and the peel strength at the interface between the carrier foil and electrodeposited metal foil that is considered to be practically appropriate. A more preferred peel strength range for the carrier foil is between 1 and 50 N/m.

A merit of the present invention is thus to have found a foil composition, which ensures an easy and homogeneous peeling of the carrier foil, even when the composite foil is used in processes involving heating. In the second metallic layer, it is preferred that the quantity of zinc, copper or cobalt be larger than that of the other metals from the combination, i.e. arsenic, manganese, tin, vanadium, molybdenum, antimony and tungsten.

When the metal foil is an ultra-thin copper foil, the present composite foil serves as a peelable composite foil in which the carrier foil can be peeled off stably by a relatively low peel strength, even after subjecting the composite foil to press-forming at temperatures over 300° C. during production of copper clad laminates. Peeling failure and remaining carrier foil fragments on a copper clad laminate after peeling, which are observed when a conventional peelable composite foil is employed, are completely prevented.

Composite foils with an ultra-thin copper foil in accordance with the present invention are thus particularly well suited for the manufacture of printed circuit boards, wherein the composite foil is laminated on substrates comprising e.g. BT resin, Teflon® and polyimides, by hot-press-forming at temperatures above 240° C. Although the peel strength will slightly increase when exposed to heat, it will remain at a level ensuring the peelability of the carrier foil until completion of press-formation. Such processes are employed to manufacture printed circuit boards to be used in harsh environments (e.g. high temperatures or chemically aggressive) and/or for high frequency applications. In this last case, which concerns e.g. mobile telecommunications and wireless data transmission; Teflon® and other resins having improved dielectric characteristics are particularly well suited.

Another advantageous aspect of the present invention is that the second metallic layer is initially designed as a dark coloured layer. Indeed, the selected combination of metals comprised in the second metallic layer provides such a dark colour. Hence after removal of the carrier foil, the ultra-thin foil has its surface covered by a dark coloured layer, which provides—due to its dark colour—a surface preparation favouring the absorption of laser light, especially from a $CO_2$ laser. It follows that an ultra-thin copper foil can be efficiently drilled by means of a $CO_2$ laser. Another merit of the present invention is thus to have found an advantageous way of carrying out a surface preparation of an ultra-thin copper foil to improve laser drilling, which is more precise than techniques using carbon deposition or electrically conductive polymers. Indeed, in the present composite foil, the surface preparation is a dark coloured layer formed by electrodeposition. The use of an electrolytic technique allows a precise control of deposition speed and thickness of the dark coloured layer, whereby its homogeneity is ensured.

However, it will be noted that when a composite foil in accordance with the present invention is subjected to temperatures exceeding 250° C. e.g. during hot-press-forming, the second metallic layer—without compromising the peelability of the carrier foil—may turn from dark to clearer colours, which increases its reflectivity. Nevertheless, this effect does not have any consequence at all when the present composite foil is not used especially for the initial, dark colour of the second metallic layer, but rather for its advantageous peeling characteristics.

It will be understood that the first layer deposited on the carrier foil is designed as a barrier layer to limit the diffusion of metals between the carrier foil and the second metallic layer when the composite foil undergoes heating, even at temperatures higher than 300° C. The composition of the first layer should thus be selected to provide this barrier effect. Chromium or molybdenum based layers are particularly contemplated for this purpose. Preferably, the first barrier layer is a chromium-based layer and may e.g. consist of electrodeposited chromium or of chromate. Its thickness may be between 0.1 and 1 µm.

In a preferred embodiment, the second metallic layer has a thickness between 0.1 and 2.2 µm, more preferably between 0.4 and 1.7 µm. Due to metal diffusion, the thickness of the second metallic layer should advantageously be adapted to the intended use of the composite foil. For example, in case the composite foil will be exposed to heat before removal of the carrier foil, the second metallic layer should preferably be sufficiently thick, so that metals from the carrier foil and from the ultra-thin metal foil only diffuse within the interface regions of the second metallic foil.

The carrier foil can be made from a variety of metals, and manufactured either by electrodeposition or lamination. The thickness of the carrier foil should advantageously be such as to allow the composite foil to be taken up into rolled form. Preferably, the carrier foil is an electrodeposited copper foil having a thickness of between 18 and 105 µm.

As already mentioned, the ultra-thin metal foil may be an ultra-thin copper foil, as the present invention thus provides an improved composite foil that may advantageously be used in the electronic and electric industry, in particular for the manufacture of printed circuit boards. The ultra-thin metal foil may however consist of other metals such as e.g. cobalt or nickel. Furthermore, the ultra-thin metal foil may consist of an alloy, or of two or more superposed layers of different metals. The thickness of the ultra-thin metal foil preferably is between 2 and 10 µm.

The back side, opposed to the front side facing the second metallic layer, of the ultra-thin copper foil may advantageously be coated with a non-reinforced thermosetting resin. Such a composite foil proves extremely advantageous in many respects in processes for manufacturing multiplayer printed circuit boards, wherein microvias are drilled by means of a $CO_2$ laser. Firstly, the carrier foil allows to handle the ultra-thin copper foil with its rather brittle, non-reinforced thermosetting resin coating without tears, cracks and wrinkles. Secondly, the composite foil can be laminated on top of a core board without intermediate insulating substrate, the ultra-thin foil being protected by the carrier foil during lamination. Thirdly, after removal of the carrier, the ultra-thin copper foil is ready to be laser drilled, since it is covered by the electrodeposited second metallic layer, which has a dark colour. Moreover, material ablation by a $CO_2$ laser beam in a non-reinforced thermosetting resin is relatively homogeneous. All these aspects of the present composite foil contribute to allow a very precise drilling of microvias, i.e. microvias having a well determined shape, diameter and height, without producing a local overheating or copper splashes.

The dark colour of the second metallic layer is believed to also improve the absorption of U.V. laser light. Employing the present composite foil in processes involving U.V. laser drilling thus permits to improve the laser drilling step, which, when carried out on a conventional shiny copper surface without surface preparation, is typically done by trepanning (i.e. drilling multiple smaller holes).

According to another aspect of the present invention, a process for manufacturing a composite foil comprising an ultra-thin metal foil supported on a metallic carrier foil and separable therefrom by peeling is proposed. The process comprises the following steps:

(a) providing a metallic carrier foil;
(b) depositing a first barrier layer on one side of the metallic carrier foil;
(c) electrodepositing a second metallic layer on the first barrier layer, the second metallic layer being electrodeposited in a bath comprising a combination of a metal selected from the group comprising zinc, copper and cobalt, and of at least one metal selected from the group comprising arsenic, manganese, tin, vanadium, molybdenum, antimony and tungsten; and
(d) electrodepositing an ultra-thin metal foil on the second metallic layer.

Indeed, it has been observed that an electrolytic bath with a metal combination as referred to at step (c) allows forming a layer having initially a dark colour and a low reflectivity, which adheres particularly well to the ultra-thin copper foil, and which ensures an appropriate peel strength for removing the carrier, even after exposing the composite foil to heat. Preferably, the combination of metals in the second metallic layer is such that the quantity of metal from the group consisting of zinc, copper or cobalt is larger than that of the metals from the group comprising arsenic, manganese, tin, vanadium, molybdenum, antimony and tungsten. The electroplating bath of step (c) may however also comprise other components in addition to the above mentioned combination of metals, which may be deposited simultaneously.

A first advantageous aspect of the present process is thus that it permits the manufacture of peelable composite foils having an appropriate peel strength. This ensures an easy removal of the carrier foil in a variety of applications, whether the composite foil is subjected to heating or not.

A further advantageous aspect of the present process is that the second metallic layer, which will generally remain at least partially on the ultra-thin metal foil after removal of the carrier foil, provides a surface preparation increasing the absorption of $CO_2$ laser light. It will be appreciated that the use of an electrolytic technique for the formation of such a layer proves very advantageous in practice. Indeed, the plating baths needed to form the second metallic layer can easily be integrated in conventional electrolytic processes used to manufacture composite foils without surface preparation.

The second metallic layer should preferably have a thickness between 0.1 and 2.2 µm, more preferably between 0.4 and 1.7 µm.

When the electrodeposited, second metallic layer is formed in a bath comprising the metal combinations of step (c), it may have a mass per unit area ranging from 1 000 to 20 000 mg/m², preferably between 4 000 and 15 000 mg/m². Furthermore, an electrodeposited second metallic layer comprising such metal combinations can easily and uniformly be removed after laser drilling by the so-called "Microetch" process, used conventionally for preparing the surface of copper tracks before the development of a brown/black oxide layer on inner layers for multi-layer boards. This Microetch process typically consists in a controlled dissolution of metallic copper in an ammonium or sodium persulphate bath.

In case the electroplated, ultra-thin layer is a copper layer, its formation is preferably carried out in two steps, and begins in a bath, which is designed so as not to dissolve the second metallic layer. Indeed, if no precaution was taken, there would be a risk of dissolving the second metallic layer, e.g. if the first layer of copper was deposited in an acidic copper plating bath. Accordingly, a first layer of copper is deposited in controlled conditions to avoid removal of the second metallic layer, and then acts as a protective layer when copper is further electrodeposited to grow the ultra-thin copper foil to the desired thickness.

The first layer of copper shall advantageously be electrodeposited in a copper pyrophosphate bath, since it gives a uniform electrodeposition of copper and, more importantly, it generally has low acidity so that it will not dissolve the second metallic layer. A copper pyrophosphate bath is particularly adapted for depositing the first layer of copper when the second metallic layer is deposited from a bath comprising a metal combination of zinc or cobalt according to step (c).

If required, similar measures can be taken for protecting the second metallic layer when metals other than copper are to be electrodeposited to form the ultra-thin metal foil.

After deposition of the first layer of copper, the ultra-thin copper foil is preferably grown to the desired thickness by further electroplating in at least one electrolytic bath comprising copper sulfate and sulphuric acid. Such baths are more advantageous than a copper pyrophosphate bath, when considering productivity and cost. Hence, the first copper layer is grown to a thickness sufficient to efficiently cover the dark coloured layer, typically at least 0.3 µm, and the ultra-thin copper foil is then preferably further grown to a thickness of between 2 and 10 µm using copper sulphate baths.

The first barrier layer is preferably a chromium-based layer. Such a chromium-based layer may consist of electrodeposited chromium or of chromate. A chromium-based barrier layer is particularly suited when the second metallic layer consists of e.g. a deposit mainly comprising zinc, as it will prevent the diffusion of zinc into the carrier foil and thereby avoid sticking of the composite foil.

When the ultra-thin foil is a copper foil, the present process shall advantageously comprise a further process step of applying to the ultra-thin copper foil a nodularizing treatment to improve adhesion of the exposed surface of the ultrathin copper foil to an insulating resin layer. Moreover, a passivation treatment may be applied to the nodularized ultra-thin copper foil to prevent oxidation thereof. Such a passivation treatment may comprise depositing at least one member of the group consisting of zinc, zinc chromate, nickel, tin, cobalt and chromium, or one of their alloys, to the nodularized ultra-thin copper foil.

Advantageously, the present process further comprises the step of coating the exposed side of the ultra-thin copper foil, preferably nodularized and passivated, with a resin. Non-reinforced thermosetting resins are preferred for laser drilling applications.

It remains to be noted that the present process can also be carried out on both sides of the carrier foil, either simultaneously, or subsequently, to provide each side of the carrier foil with a first barrier layer, a second metallic layer and an ultra-thin metal foil. As a result, a composite foil supporting an ultra-thin metal foil on each of its sides can be manufactured.

DETAILED DESCRIPTION OF A PREFERRED EMBODIMENT

A preferred embodiment of the process for manufacturing a composite foil in accordance with the present invention will now be described in detail herebelow, by way of example. More precisely, the process described herebelow concerns the production of a peelable composite foil with an ultra-thin copper foil.

In producing the composite foil in accordance with the present process, the different layers are successively deposited over each other on the carrier foil.

The carrier foil is preferably formed by electrodeposition of copper from an electrolyte solution onto a rotating titanium cathode drum. The electrolyte solution is circulated between the cathode drum and a closely spaced anode. A typical electrolyte solution comprises 70 to 110 g/l of copper (as copper sulphate) and 80 to 120 g/l of sulphuric acid. The parameters of electrodeposition are preferably adjusted to grow a carrier foil with a thickness between 18 and 105 µm, e.g. of 35 µm or 70 µm.

The carrier foil is then passed through a number of electroplating baths to deposit the different layers on the carrier foil. In the present embodiment, the carrier foil is in strip form, and is thus continuously passed through the plating baths. It is however clear that, if the carrier foil had the form of a sheet, it could be treated successively in each of the plating baths.

Firstly, the carrier foil is passed through a first bath, in which a first barrier layer is electrodeposited on one side of the carrier foil. This first barrier layer is designed to limit the diffusion of metals between the carrier foil and the second metallic layer that will be deposited in the next step. The first barrier layer will generally be formed on the so-called shiny side of the carrier foil, i.e. the side which was in contact with the cathode drum during manufacturing of the carrier foil. However, it is also possible to form the first barrier layer on the opposite, mat side of the carrier foil.

It goes without saying that the first barrier layer has to allow further electrodeposition, since the second metallic layer will be electrodeposited thereon. The first barrier layer is preferably a chromium-based layer with a very thin thickness, typically of about 0.1 µm. Such an extremely thin thickness is typically not measured but calculated from the weight of chromium deposited per unit surface and from the chromium density. The barrier layer may be formed in a chromium plating bath containing 180 to 300 g/l of chromic acid (calculated as $CrO_3$) and 1.8 to 3 g/l of sulphuric acid ($H_2SO_4$). The electrical current density should be in the range of 5 to 40 $A/dm^2$ and the bath temperature in the range of 18 to 60° C.

Although a barrier layer of electroplated chrome is preferred since it gives a uniform deposition, the barrier layer may alternatively be a chromate layer formed by immersion or electrolysis in a bath containing hexavalent chromium ions.

After the deposition of the first barrier layer, the carrier foil is passed through a second bath, in which a second metallic layer is electrodeposited on the first barrier layer. This second bath comprises a combination of a metal selected from the group comprising zinc, copper and cobalt, and of at least one metal selected from the group comprising arsenic, manganese, tin, vanadium, molybdenum, antimony and tungsten. A second metallic layer comprising such a combination of metals has a mat, dark-coloured appearance, as well as good adherence properties with the ultra-thin foil that will be deposited thereon. In addition, this second metallic layer will play the role of a separation layer by allowing removal of the carrier foil at an appropriate peel strength. Such electrolytic baths will be presented in more detail herebelow. Preferably, the second metallic layer comprises a quantity of zinc, copper or cobalt which is greater than that of metals of the second group, i.e. arsenic, manganese, tin, vanadium, molybdenum, antimony and tungsten.

It is to be noted that the use of an electrolytic technique for depositing the second metallic layer allows a precise control of deposition speed and thickness of the second metallic layer, whereby its homogeneity is ensured.

In the next step, the carrier foil with the first barrier layer and the second metallic layer thereon is passed through a third bath, in which a first layer of copper is electrodeposited on the second metallic layer in an electrolytic bath which does not remove the second metallic layer. This electrolytic bath is preferably a copper pyrophosphate bath, which gives a uniform electrodeposition. More importantly, it does not tend to dissolve a second metallic layer mainly made of zinc or cobalt, which would occur if an acidic copper sulphate bath were to be used. Although copper pyrophosphate plating is preferred since it is advantageous with respect to the environment and safety of operations, the first layer of copper could also be formed in a copper cyanide bath.

It is preferred that the copper concentration in the copper pyrophosphate bath be about 16 to 38 g/l and that the potassium pyrophosphate be about 150 to 250 g/l. The pH preferably should be about 8 to 9.5. The bath temperature should be about 45 to 60° C. The copper pyrophosphate bath may further comprise some conventional additives, in particular organic additives. When used at controlled, limited concentrations, organic additives refine the grain structure, impart levelling characteristics to the plating bath, and act as brighteners. Alkali metals or organic acids have also been used as brighteners.

The deposition of the ultra-thin copper foil thus begins in this copper pyrophosphate bath where a first layer of copper is deposited on the second metallic layer. The first layer of copper is preferably grown to a thickness which is sufficient to cover the second metallic layer, typically at least 0.3 µm. The ultra-thin copper layer is further grown to the desired thickness using a copper sulphate bath, which is advantageous with respect to productivity and cost.

In practice, copper is further electrodeposited on the first copper layer by passing the carrier foil through a plurality of copper sulphate plating baths, until the desired thickness is obtained. The greater the thickness of the ultra-thin foil, the greater the number of copper sulphate plating baths.

It is preferred that the copper concentration in the copper sulphate plating baths be about 30 to 110 g/l and that the sulphuric acid be about 30 to 120 g/l. The operating electric current density should be in the range of 5 to 60 $A/dm^2$. The bath temperature should be in the range of 30 to 70° C.

The resulting composite foil thus comprises a carrier foil, and successively a first barrier layer, a second metallic layer, and an ultra-thin copper foil. For further reference, the side of the ultra-thin copper foil in contact with the second metallic layer will be called front side, and its opposite side will be called back side.

It is to be noted that the second metallic layer deposited in a plating bath comprising the above mentioned combination of metals has good adherence properties with the ultra-thin copper foil.

It is further to be noted that the first, chromium-based layer isolates the second metallic layer from the carrier foil; in particular, it allows to control the diffusion of metals from the second metallic layer into the carrier foil. The first barrier layer thus contributes to ensuring the separation (or release) of the carrier foil after lamination of the composite foil, e.g. on a prepreg or on a core board having an outer wiring circuit. Indeed, during lamination, the composite foil is submitted to heat and pressure for a certain duration. Without such a release layer, the zinc—in case of a zinc based second layer—would diffuse into the carrier foil—alloying with copper into brass—and the carrier foil could not be removed from the ultra-thin copper foil.

Due to the good adherence of the second metallic layer to the ultra-thin foil, the ultra-thin foil is covered—after removal of the carrier foil—by a layer having a dark colour. As a matter of fact, with a composite foil manufactured in accordance with the present process, the separation of the carrier foil and the ultrathin copper foil generally occurs inside the second metallic layer. Hence, both the first barrier layer and the front side of the ultrathin copper foil are covered, over their whole surface, by a certain thickness of dark coloured metallic material.

As a result, the ultra-thin copper foil has a front side with a dark colour, and is thus much darker than the surface of a conventional copper foil (without surface preparation), which typically has a highly reflecting, shiny reddish colour. In addition, the front side of the ultra-thin copper foil is relatively mat. Such a low reflecting, mat, dark coloured front side of the present ultra-thin copper foil is particularly well adapted for $CO_2$ laser drilling. It is however clear that it can also improve drilling conditions with other lasers.

It is to be further noted that the present process permits the manufacture of peelable composite foils having an appropriate peel strength. This ensures an easy removal of the carrier foil in a variety of applications, whether the composite foil is subjected to heating or not.

Referring now more specifically to the electrodeposition of the dark coloured layer, three plating baths will now be described in detail.

A first preferred plating bath (bath A) for the electrodeposition of the second metallic layer comprises a combination of zinc and antimony. More specifically, such a plating bath should comprise 10 to 40 g/l of zinc and 1 to 3 g/l of antimony. The pH of this plating bath should preferably be about 1 to 3. The electrical current density should be in the range of 5 to 15 A/dm$^2$.

A second preferred plating bath (bath B) for the electrodeposition of the second metallic layer comprises a combination of copper and arsenic. More specifically, such a plating bath shall comprise about 2.5 to 7.5 g/l of copper, about 0.1 to 1 g/l of arsenic, and about 40 to 120 g/l of sulphuric acid. The electrical current density should be in the range of 5 to 15 A/dm$^2$.

A third preferred plating bath (bath C) for the, electrodeposition of the second metallic layer comprises a combination of cobalt and molybdenum. More specifically, such a plating bath shall comprise about 7 to 30 g/l of cobalt, about 2 to 15 g/l of molybdenum, and about 10 to 30 g/l of $H_3BO_3$. The pH of this plating bath should preferably be about 2 to 6 and its temperature about 15 to 50° C. The electrical current density should be in the range of 5 to 15 A/dm$^2$.

It remains to be noted that, in order to enhance adhesion of the back side of the ultra-thin copper foil to an insulating resinous material, a nodularizing treatment may be applied to the back side of the ultra-thin copper foil. Such a treatment may be conventionally carried out by forming nodular copper deposits on the back side by adjusting plating conditions. After the nodularizing treatment is completed, a conventional passivation treatment may be added to the back side of the ultra-thin copper foil, such as by depositing zinc, zinc chromate, nickel, tin, cobalt and chromium on the nodularized back side.

A composite foil produced according to the previously described process can be laminated on top of a core board having an outer wiring circuit, with an intermediate insulating substrate. Such an intermediate substrate may e.g. be a laser prepreg (based on a glass cloth which is more adapted to laser drilling than conventional fabrics) or a resin impregnated organic reinforcement such as Aramid based Thermount® (a registered trademark from Dupont). Alternatively, the composite foil manufactured by the previously described process may be coated with a non-reinforced thermosetting resin. The resin coating should preferably have a thickness sufficient to allow lamination of the resin coated composite foil on a core board, without additional intermediate insulating substrate.

EXAMPLE 1

A composite foil was manufactured according to the previously described method. The second metallic layer was deposited in an electrolytic bath comprising the above mentioned combination of zinc and antimony (bath A). The composite foil was laminated onto a resinous substrate through hot-press-forming at a temperature of 225° C. for 180 min. The carrier foil was removed; a peel strength of about 15 N/m was measured. The separation occurred in the second metallic layer. The front side of the ultra-thin copper foil was covered over its entire surface by dark-coloured material.

The colour of the front side of the ultra-thin copper foil was determined according to the L*,a*,b*-system (DIN 6174). The results are shown in table 1 below, in which are also presented the results obtained with a conventional electrodeposited ultra-thin copper foil, which was directly deposited onto the chromium release layer, i.e. without surface preparation. In the L*,a*,b*-system, L* defines the position on the light-dark axis, a* on the red-green axis and b* on the blue-yellow axis.

TABLE 1

|    | conventional ultra-thin copper foil | ultra-thin copper foil covered with Zn/Sb layer |
|----|----|----|
| L* | 80 | 39–48 |
| a* | 16.6 | 0.8–2.1 |
| b* | 15.7 | 2.9–6.5 |

EXAMPLE 2

A composite foil was manufactured according to the above described method, however the second metallic layer was deposited in an electrolytic bath comprising the above mentioned combination of copper and arsenic (bath B). The composite foil was laminated onto a resinous substrate through hot-press-forming at a temperature of 185° C. for 120 min. The carrier foil was removed; a peel strength of about 30 N/m was measured. The separation occurred in the second metallic layer. The front side of the ultra-thin copper foil was covered over its entire surface by dark-coloured material.

The colour of the front side of the ultra-thin copper foil was determined according to the L*,a*,b*-system. The results are shown in table 2 below, in which are also presented the results obtained with a conventional electrodeposited ultra-thin copper foil, which was directly deposited on the chromium release layer, i.e. without surface preparation.

TABLE 2

|    | conventional ultra-thin copper foil | ultra-thin copper foil covered by Cu/As layer |
|----|-------------------------------------|------------------------------------------------|
| L* | 80                                  | 25–32                                          |
| a* | 16.6                                | 5–10                                           |
| b* | 15.7                                | 4–11                                           |

EXAMPLE 3

A composite foil was manufactured according to the above described method. The second metallic layer was deposited in an electrolytic bath comprising the above mentioned combination of cobalt and molybdenum (bath C). The composite foil was laminated onto a resinous substrate through hot-press-forming at a temperature of 180° C. for 120 min. The carrier foil was removed; a peel strength of about 30 N/m was measured. The separation occurred in the second metallic layer. The front side of the ultra-thin copper foil was covered over its entire surface by dark-coloured material.

The colour of the front side of the ultra-thin copper foil was determined according to the L*,a*,b*-system. The results are shown in table 3 below, in which are also presented the results obtained with a conventional electrodeposited ultra-thin copper foil, which was directly deposited on the chromium release layer, i.e. without surface preparation.

TABLE 3

|    | conventional ultra-thin copper foil | ultra-thin copper foil covered by Co/Mo layer |
|----|-------------------------------------|------------------------------------------------|
| L* | 80                                  | 29–36                                          |
| a* | 16.6                                | 0.1–0.3                                        |
| b* | 15.7                                | 3.1–5                                          |

EXAMPLE 4

A composite foil manufactured in the conditions of example 1 (bath A) was laminated onto a resinous substrate through hot-press-forming at a temperature of 300° C. for 60 min. The carrier foil was removed; a peel strength of about 20 N/m was measured.

The separation occurred in the second metallic layer. The front side of the ultra-thin copper foil was covered over its entire surface by material from the second metallic layer, which had a clearer colour than in example 1.

The invention claimed is:

1. A composite foil of the peelable type comprising:
   a metallic carrier foil;
   a first barrier layer on one side of said metallic carrier foil;
   a second metallic layer on said first barrier layer, said second metallic layer comprising a combination of a metal selected from the group consisting of zinc, copper and cobalt, and of at least one metal selected from the group consisting of arsenic, manganese, tin, vanadium, molybdenum, antimony and tungsten; and
   an electrodeposited, ultra-thin metal foil on said second metallic layer.

2. The composite foil according to claim 1, wherein said ultra-thin metal foil is a copper foil, a cobalt foil or a nickel foil.

3. The composite foil according to claim 1, wherein said second metallic layer is a dark coloured layer.

4. The composite foil according to claim 3, wherein said second metallic layer is designed as a separation layer, so that, when said carrier foil is removed from said ultra-thin metal foil, at least part of said second metallic foil remains on said ultra-thin metal foil.

5. The composite foil according to claim 1, wherein said metallic carrier foil has a peel strength in the range of 1 to 200 N/m.

6. The composite foil according to claim 5, wherein said metallic carrier foil has a peel strength in the range of 1 to 50 N/m.

7. The composite foil according to claim 1, wherein said first barrier layer is a chromium-based or a molybdenum-based layer.

8. The composite foil according to claim 7, wherein said first barrier layer is a chromium-based layer consisting of chromium or of chromate.

9. The composite foil according to claim 1, wherein said second metallic layer has a mass per unit area between 1000 and 20000 mg/m$^2$.

10. The composite foil according to claim 9, wherein said second metallic layer has a mass per unit area between 4000 and 15000 mg/m$^2$.

11. The composite foil according to claim 1, wherein said second metallic layer has a thickness between 0.1 and 2.2 μm.

12. The composite foil according to claim 11, wherein said second metallic layer has a thickness between 0.4 and 1.7 μm.

13. The composite foil according to claim 1, wherein said ultra-thin metal foil has a thickness between 2 and 10 μm.

14. The composite foil according to claim 1, wherein said carrier foil is an electrodeposited or laminated metal foil having a thickness between 18 and 105 μm.

15. The composite foil according to claim 1, wherein said electrodeposited, ultra-thin metal foil comprises on its side opposed to said second metallic layer adhesion-enhancing nodules and a passivation layer.

16. The composite foil according to claim 1, wherein said electrodeposited, ultra-thin metal foil comprises on its side opposed to said second metallic layer a resin layer.

17. The composite foil according to claim 16, wherein said resin layer is a non-reinforced resin layer.

18. The composite foil according to claim 1, further comprising on the other side of said carrier foil another of said first barrier layer, another of said second metallic layer and another of said ultra-thin metal foil.

19. The composite foil according to claim 4, wherein said ultra-thin metal foil is a copper foil.

20. A process for manufacturing a composite foil comprising an ultra-thin metal foil supported on a metallic carrier foil and separable therefrom by peeling, said process comprising the following steps:
   (a) providing a metallic carrier foil;
   (b) depositing a first barrier layer on one side of said metallic carrier foil;
   (c) electrodepositing a second metallic layer on said first barrier layer, said second metallic layer being electrodeposited in a bath comprising a combination of a metal selected from the group consisting of zinc, copper and cobalt, and of at least one metal selected from the group consisting of arsenic, manganese, tin, vanadium, molybdenum, antimony and tungsten; and (d) electrodepositing an ultra-thin metal foil on said second metallic layer.

21. The process according to claim 20, wherein said first barrier layer is a chromium-based layer or a molybdenum-based layer.

22. The process according to claim 21, wherein said first barrier layer is a chromium-based layer consisting of chromium or of chromate.

23. The process according to claim 20, wherein said second metallic layer is a dark coloured layer.

24. The process according to claim 23, wherein said second metallic layer is designed as a separation layer, so that, when said carrier foil is separated from said ultra-thin metal foil, at least part of said second metallic foil remains on said ultra-thin metal foil.

25. The process according to claim 20, wherein said second metallic layer has a mass per unit area between 1000 and 20000 $mg/m^2$.

26. The process according to claim 25, wherein said second metallic layer has a mass per unit area between 4000 and 15000 $mg/m^2$.

27. The process according to claim 20, wherein said second metallic layer has a thickness between 0.1 and 2.2 µm.

28. The process according to claim 27, wherein said second metallic layer has a thickness between 0.4 and 1.7 µm.

29. The process according to claim 20, wherein said ultra-thin metal foil is a copper foil, a cobalt foil or a nickel foil.

30. The process according to claim 20, wherein said ultra-thin metal foil is a copper foil and wherein said electrodeposition of said ultra-thin copper foil at step (d) comprises:

a first step (d1) of electrodepositing on said second metallic layer a first layer of copper in a first bath, which is designed so as not to dissolve said metallic separation layer; and a second step (d2) of electrodepositing on said first layer of copper, in at least one further bath, sufficient copper to provide a desired thickness of said ultra-thin copper foil.

31. The process according to claim 30, wherein said electrodeposition of step (d1) employs an electrolytic bath comprising copper pyrophosphate to deposit said first layer of copper, followed by said electrodeposition of step (d2) using at least one electrolytic bath comprising copper sulfate and sulfuric acid.

32. The process according to claim 31, wherein said first layer of copper is at least 0.3 µm thick and the thickness of said ultra-thin copper foil is between 2 and 10 µm.

33. The process according to claim 20, wherein said ultra-thin metal foil has a thickness between 2 and 10 µm.

34. The process according to claim 20, wherein said metallic carrier foil is an electrodeposited or laminated copper foil having a thickness between 18 and 105 µm.

35. The process according to claim 20, further comprising the step of applying to said ultra-thin metal foil a nodularizing treatment to improve the adhesion properties of the exposed surface of said ultra-thin metal foil.

36. The process according to claim 35, further comprising the step of applying a passivation treatment to said nodularized ultra-thin metal foil to prevent oxidation thereof.

37. The process according to claim 36, wherein said passivation treatment comprises depositing at least one member of the group consisting of zinc, zinc chromate, nickel, tin, cobalt and chromium, or one of their alloys, to said nodularized ultra-thin metal foil.

38. The process according to claim 20, further comprising the steps of applying a nodularizing treatment to the exposed side of said ultra-thin metal foil, and coating said exposed side with a resin.

39. The process according to claim 38, wherein said resin is a non-reinforced resin.

40. The process according to claim 20, wherein the uncovered other side of said metallic carrier foil is submitted, either simultaneously or subsequently, to the same process steps applied to said one side of the metallic carrier foil, so as to successively provide to said other side of said metallic carrier foil another of said first barrier layer, another of said second metallic layer and another of said second ultra-thin metal foil.

* * * * *